US 6,586,276 B2

(12) United States Patent
Towle et al.

(10) Patent No.: US 6,586,276 B2
(45) Date of Patent: Jul. 1, 2003

(54) METHOD FOR FABRICATING A MICROELECTRONIC DEVICE USING WAFER-LEVEL ADHESION LAYER DEPOSITION

(75) Inventors: Steven Towle, Phoenix, AZ (US); Hajime Sakamoto, Gifu-ken (JP); Dongdong Wang, Ogaki (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/903,025

(22) Filed: Jul. 11, 2001

(65) Prior Publication Data

US 2003/0013232 A1 Jan. 16, 2003

(51) Int. Cl.⁷ .......................... H01L 21/44; H01L 21/48
(52) U.S. Cl. ........................................ 438/113; 438/110
(58) Field of Search ................................. 438/110, 113, 438/114, 126, 127, 460, 462, 465, 106, 118, 119, 758, 778

(56) References Cited

U.S. PATENT DOCUMENTS

| 5,048,179 | A |   | 9/1991  | Shindo et al. ................. 29/840  |
| 5,346,858 | A | * | 9/1994  | Thomas et al. ............... 437/189   |
| 5,353,498 | A |   | 10/1994 | Fillion et al. .................. 29/840 |
| 5,422,513 | A |   | 6/1995  | Marcinkiewicz et al. ... 257/668      |
| 5,497,033 | A |   | 3/1996  | Fillion et al. ................ 257/723 |
| 5,508,229 | A |   | 4/1996  | Baker ......................... 437/183 |
| 5,527,741 | A |   | 6/1996  | Cole et al. ................... 437/209 |
| 5,703,400 | A | * | 12/1997 | Wojnarowski et al. ...... 257/723      |
| 5,745,984 | A |   | 5/1998  | Cole, Jr. et al. .............. 29/834 |
| 5,870,822 | A |   | 2/1999  | Drake et al. ................... 29/840 |
| 5,892,287 | A |   | 4/1999  | Hoffman et al. ............. 257/777   |
| 5,939,782 | A |   | 8/1999  | Malladi ....................... 257/698 |
| 6,002,163 | A |   | 12/1999 | Wojnarowski .............. 257/620     |
| 6,025,275 | A |   | 2/2000  | Efland et al. ............... 438/722   |
| 6,154,366 | A |   | 11/2000 | Ma et al. ..................... 361/704 |
| 6,162,652 | A | * | 12/2000 | Dass et al. ..................... 438/18 |
| 6,204,074 | B1 | * | 3/2001 | Bertolet et al. ................ 438/18 |
| 6,242,282 | B1 |   | 6/2001 | Fillion et al. ................ 438/106 |
| 6,262,579 | B1 |   | 7/2001 | Chazan et al. ............... 324/537   |
| 6,271,469 | B1 |   | 8/2001 | Ma et al. .................... 174/52.4  |
| 6,277,669 | B1 | * | 8/2001 | Kung et al. .................. 438/106  |
| 6,281,046 | B1 | * | 8/2001 | Lam ........................... 438/113 |
| 6,284,566 | B1 |   | 9/2001 | Lee et al. .................... 438/107  |
| 6,287,893 | B1 | * | 9/2001 | Elenius et al. ............... 438/108  |
| 6,309,912 | B1 |   | 10/2001| Chiou et al. ................. 438/118  |
| 6,316,830 | B1 |   | 11/2001| Lin ............................ 257/737 |
| 6,326,701 | B1 |   | 12/2001| Shinogi et al.                          |
| 6,346,743 | B1 |   | 2/2002 | Figueroa et al. ............. 257/723   |

FOREIGN PATENT DOCUMENTS

| JP | 11045955 | 2/1999  | ........... H01L/23/12 |
| JP | 11312868 | 11/1999 | ........... H05K/3/46  |

* cited by examiner

Primary Examiner—Kamand Cuneo
Assistant Examiner—Scott Geyer
(74) Attorney, Agent, or Firm—Schwegman, Lundberg, Woessner & Kluth, P.A.

(57) ABSTRACT

A passivation layer is formed over a semiconductor wafer carrying a plurality of independent circuits. The passivation layer includes openings to expose bond pads on the wafer. A conductive adhesion material is then deposited over the wafer and an optional protection layer is deposited over the conductive adhesion material. The wafer is then cut up into individual microelectronic dice. During a subsequent packaging process, one or more microelectronic dice are fixed within a package core to form a die/core assembly. Expanded bond pads are then formed over the die/core assembly. The adhesion material on each die enhances the adhesion between the expanded bond pads and the passivation material on the die. One or more metal layers are then built up over the die/core assembly to provide, for example, conductive communication between the terminals of the die and the external contacts/leads of the package.

31 Claims, 9 Drawing Sheets

METHOD FOR FABRICATING A MICROELECTRONIC DEVICE USING WAFER-LEVEL ADHESION LAYER DEPOSITION

FIELD OF THE INVENTION

The invention relates generally to microelectronic circuits and, more particularly, to techniques and structures for packaging such circuits.

BACKGROUND OF THE INVENTION

After a microelectronic circuit chip (i.e., a die) has been manufactured, the chip is typically packaged before it is sold to the public. The package provides both protection for the chip and a convenient and often standardized method for mounting the chip within an external system. The circuit package must include some means for providing electrical communication between the various terminals of the circuit chip and the exterior environment. Many different packaging technologies have been used in the past for providing this communication. The type of package that is used for a particular chip can have a significant impact on the performance of the completed device. Typically, in a high volume manufacturing environment, cost will be a primary concern in selecting a packaging technology. Performance is also a very important criterion. As circuits get smaller and faster, there is an ongoing need for innovative and cost effective packaging technologies.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to techniques and structures for packaging microelectronic circuits using a build up process on the surface of a microelectronic die. That is, one or more metallization layers are built up over the die as part of the packaging process to provide for electrical interconnection between the terminals of the die and the exterior environment (e.g., an exterior circuit board). During wafer-level processing, a passivation layer is deposited on the surface of a wafer carrying a plurality of independent circuits. Openings are formed in the passivation layer in locations corresponding to bond pads on the surface of the wafer. An adhesion layer is next deposited on the wafer over the passivation layer. A protection layer can also be applied to the wafer to protect the adhesion layer. The wafer is eventually cut up into individual microelectronic dice that need to be packaged.

In one packaging approach, one or more microelectronic dice (each having an adhesion layer already applied) are fixed within a package core to form a die/core assembly. A number of expanded bond pads are then formed over the die/core assembly in locations corresponding to the bond pads on the surface of the die. Each of the expanded bond pads is conductively coupled to at least one of the original bond pads through a corresponding opening in the passivation layer. The adhesion layer on the die enhances the adhesion of the expanded bond pads to the passivation material. In at least one embodiment, a semi-additive metallization process is used to form the expanded bond pads. An electroless seed layer is first deposited over the upper surface of the die/core assembly to provide a conductive connection between the die and the edge of the package core to support the plating process. The expanded bond pads are then pattern-plated over the die/core assembly using the electroless seed layer as a current path. After the expanded bond pads have been formed, the adhesion layer and the electroless seed layer are removed from regions between and around the expanded pads. One or more build up metallization layers are then formed over the die/core assembly.

In a preferred approach, the expanded bond pads are each considerably larger (at least in a plane defined by the passivation layer) than the original bond pad openings on the upper layer of the wafer. In this manner, a significant increase in the package-to-die via alignment budget can be achieved using the expanded bond pads. In addition, as will be described in greater detail, in a multi-chip packaging arrangement, an enhanced level of alignment can be achieved within a package by applying the expanded bond pads after the individual dice have been fixed within the package core. Furthermore, because the adhesion layer and the optional protection layer are applied during wafer-level processing, a number of problems typically associated with the application of such layers on the panel (e.g., using sputter deposition techniques) are avoided. The inventive techniques can be used in connection with a wide variety of microelectronic circuit types including, for example, digital data processing devices and logic circuits. The techniques are particularly advantageous when used in connection with multiple chip modules.

As is well known, semiconductor wafers are typically large disk like structures that can carry hundreds or even thousands of independent circuits. As used herein, the phrase "independent circuits" is used to refer to the individual circuits or systems on the wafer that will eventually be separated from one another during wafer dicing. During wafer-level processing, the wafer is processed in a known manner to develop a plurality of independent circuits (e.g., microprocessor circuits) distributed across an upper surface thereof. Each of the independent circuits on the wafer will usually include multiple layers of internal circuitry. Bond pads are formed on the top of the wafer to provide an electrical interface to the internal circuitry. After wafer processing is complete, the wafer is typically cut up into separate circuit chips or dice.

Figure 1:
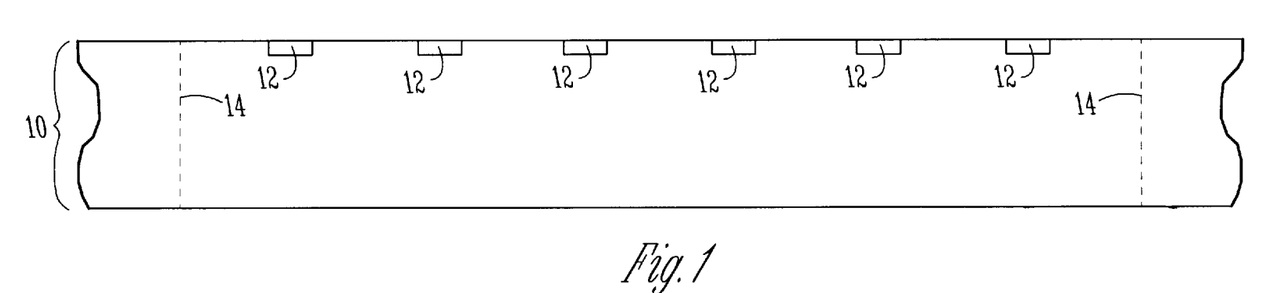
FIGS. 1, 2, 3, 4, 5, and 6 are diagrams illustrating a method for fabricating a microelectronic die in accordance with one embodiment of the present invention.

FIGS. 1–6 are a series of simplified diagrams illustrating a method for fabricating a microelectronic die in accordance with one embodiment of the present invention. FIG. 1 is a cross sectional side view illustrating a portion of a wafer 10 after circuitry and associated bond pads 12 have been formed thereon. For ease of illustration and to facilitate understanding, the individual circuitry layers are not shown in the figure. Boundary lines 14 are shown in FIG. 1 to indicate where the wafer 10 will eventually be cut to form an individual die. Thus, the region of the wafer 10 between the two boundary lines 14 corresponds to a single independent circuit. In FIG. 1, six bond pads 12 are shown between the boundary lines 14. The actual number of bond pads 12 used in a particular circuit will vary depending upon, for example, the complexity of the circuit. As they are normally formed using conventional fab processing techniques, the bond pads 12 on the wafer 10 are typically relatively thin structures (e.g., <4 micrometers in thickness).

Figure 2:
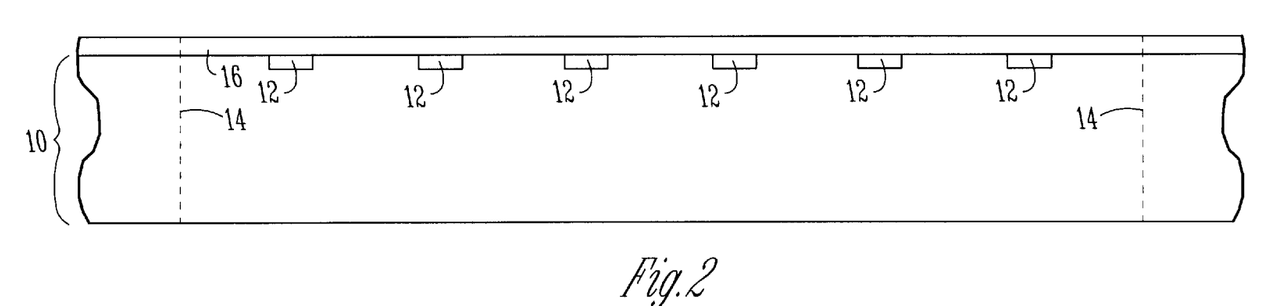
Figure 3:
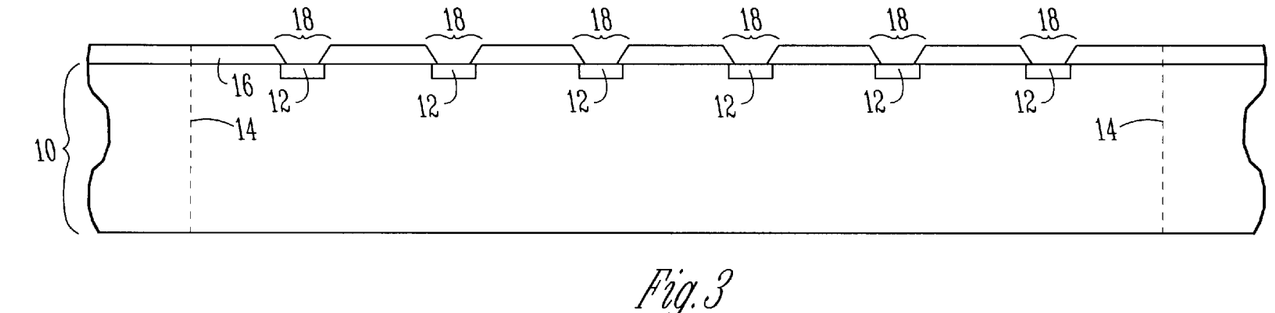
Figure 4:
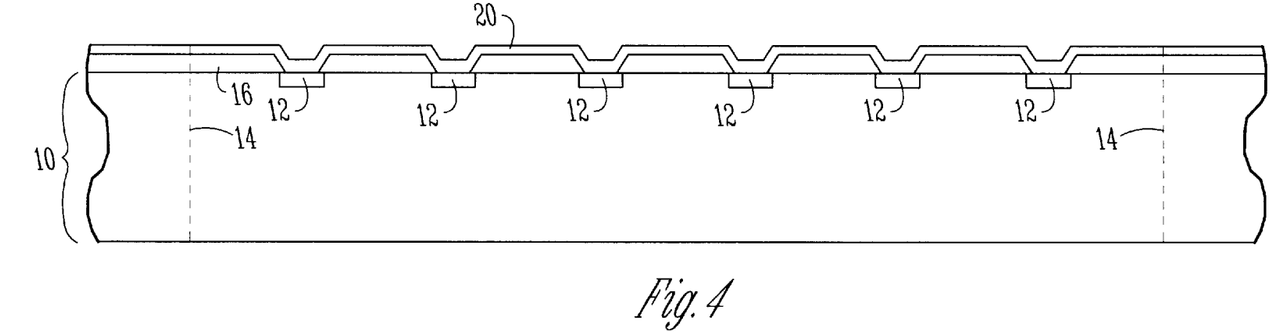

With reference to FIG. 2, a passivation layer 16 is next deposited on the upper surface of the wafer 10. Among other functions, the passivation layer 16 is used to protect the underlying circuitry from the surrounding environment. Typically, the passivation layer 16 will consist of a dielectric material such as silicon nitride, silicon dioxide, and/or polyimide. Other materials and/or combinations of materials are also possible. After the passivation layer 16 has been deposited, openings 18 are formed in the passivation layer 16 to expose portions of the underlying bond pads 12, as illustrated in FIG. 3. In one approach, a mask having the desired pattern of openings is first formed over the passivation layer 16. The openings are then etched into the, passivation material. The mask material may then be removed. Other techniques for forming the openings 18 in the passivation layer 16 are also known. The completed passivation layer will preferably overlap and cover the bond pad edges to provide a complete moisture barrier. As illustrated in FIG. 4, an adhesion layer 20 is deposited on the wafer 10 after the openings 18 have been formed in the passivation layer 16. In a preferred embodiment, a layer of titanium is sputter deposited on the wafer 10 to form the adhesion layer 20. Other materials (e.g., chromium, tungsten, tantalum) or alloys and other deposition processes can alternatively be used.

The adhesion layer 20 is applied to the wafer 10 to enhance the adhesion of expanded bond pads that will be formed over the passivation material during a subsequent packaging process. For reasons that will be explained shortly, certain benefits can be achieved by depositing the expanded bond pads during package level processing. In conceiving the present invention, however, it was appreciated that sputter deposition of the adhesion material at the package level (e.g., directly on the die/core assembly) can lead to a myriad of problems. For example, sputtering at the package level can cause an outgassing of volatiles from organic panel constituent materials. Sputtering at the package level can also be relatively expensive and present problems with the reliability of the tooling. Therefore, in accordance with one aspect of the present invention, the adhesion layer 20 is applied during wafer level processing, but the expanded bond pads are applied during packaging.

Figure 5:
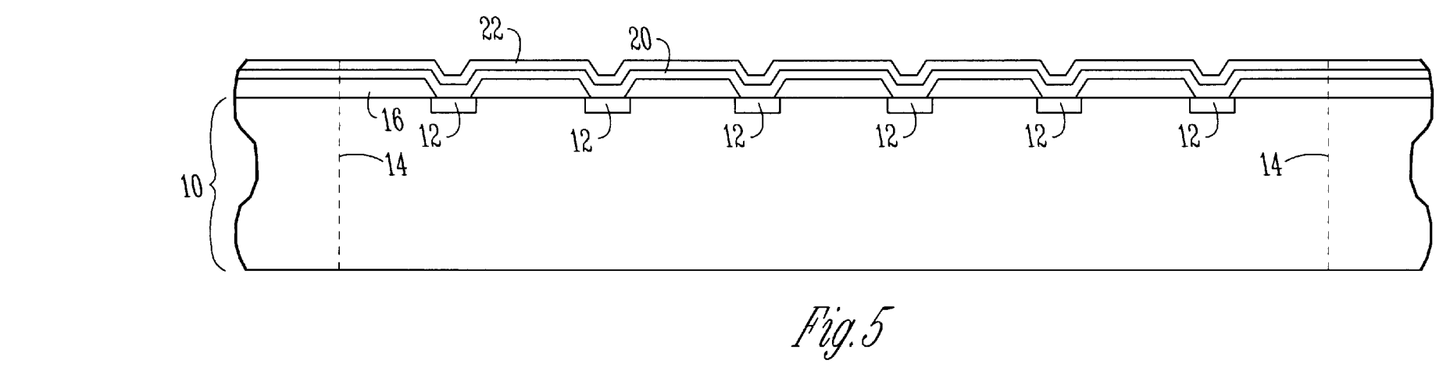
Figure 6:
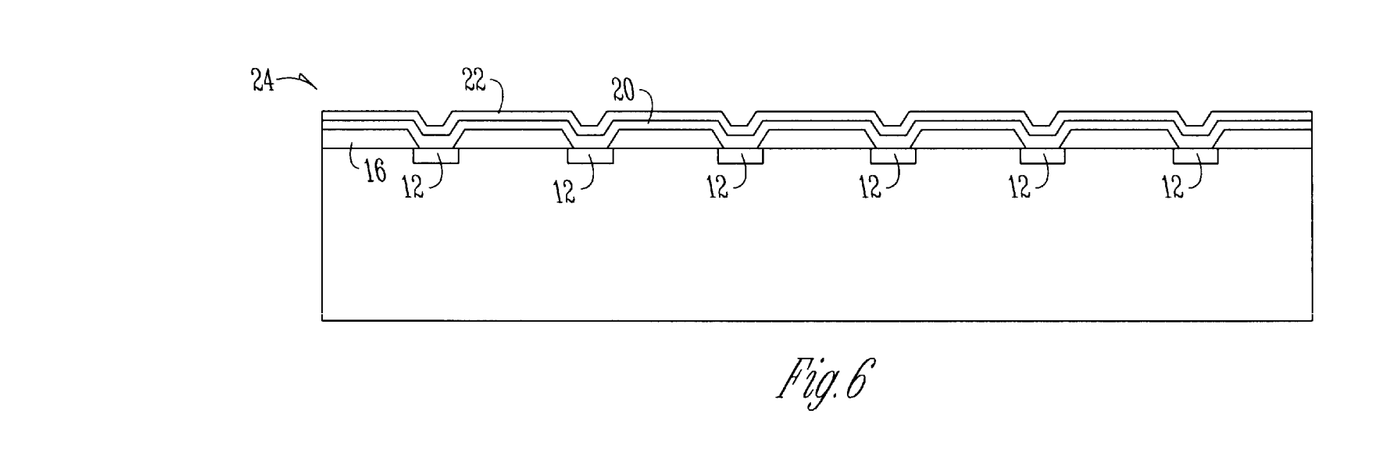

After the adhesion layer 20 has been applied, an optional protection layer 22 can be deposited over the wafer 10, as illustrated in FIG. 5. One function of the protection layer 22 is to provide protection for the adhesion layer 20 from, for example, oxidation, contamination, or other potentially harmful processes. In one approach, the protection layer 22 is formed from the same material that will subsequently be used to fabricate the expanded bond pads (e.g., copper). Other possible materials include, for example, nickel, gold, organic metal finishing agents, and others. In many cases, a die manufacturer will send out the completed dice to be packaged by an outside vendor. In such cases, the protection layer 22 can protect the adhesion layer 20 on each die until package processing is commenced. Like the adhesion layer 20, the protection layer 22 is preferably sputter deposited. In one approach, the protection layer is sputter deposited without vacuum break between the adhesion and protection layer deposition. Other deposition techniques can also be used. As illustrated in FIG. 6, the wafer 10 is eventually cut up to form individual microelectronic dice 24.

After the wafer 10 has been diced, each individual die 24 needs to be packaged. As described above, in a preferred approach, each individual die 24 is packaged by building up one or more metal layers on a surface of the die 24. The die 24 is first mounted within a package core to form a die/core assembly. Expanded bond pads are then formed on the die/core assembly. Metal layers are then built up over the die/core assembly to provide, among other things, conductive communication between the terminals of the die 24 and the leads/contacts of the package.

Figure 7:
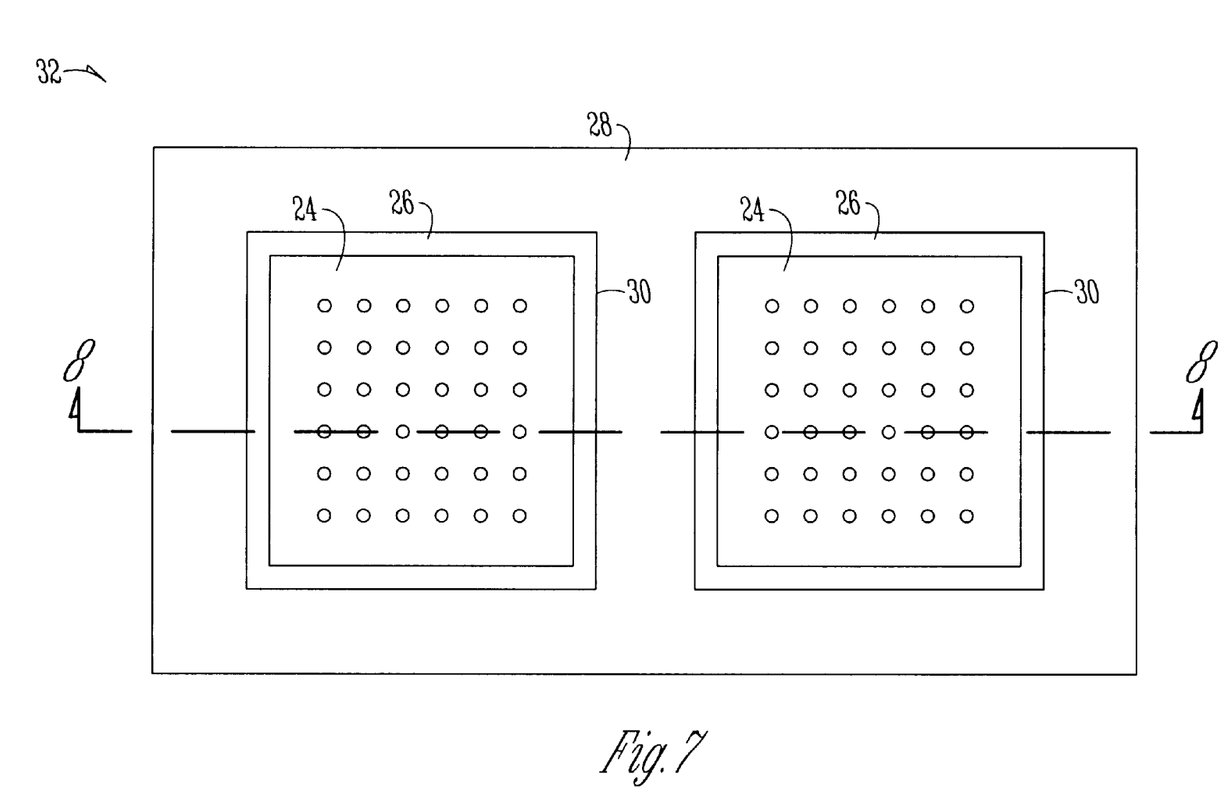
FIG. 7 is a top view of a multiple-chip die/core assembly in accordance with one embodiment of the present invention.

FIG. 7 is a simplified top view of a multiple-chip die/core assembly 32 in accordance with one embodiment of the present invention. As described above, the principles of the present invention are particularly beneficial when implemented in connection with multi-chip microelectronic devices. Therefore, the discussion that follows will focus on a multi-chip arrangement. It should be appreciated, however, that the inventive principles can also be practiced in connection with single chip devices. As illustrated in FIG. 7, the die/core assembly 32 includes two individual dice 24 fixed within a package core 28. In the illustrated arrangement, the two dice 24 are substantially the same size and have the same pad count. It should be appreciated that multiple dice having different sizes and/or pad counts can also be mounted within a single core in accordance with the present invention. It should also be appreciated that more than two dice can be mounted within a single core in accordance with the present invention.

Each die 24 is fixed within a corresponding opening 30 of the core 28 using an encapsulation material 26 (e.g., plastics, resins, epoxies, elastomers, and the like). In one approach, the dice 24 are first positioned within their respective openings 30 and the encapsulation material 26 is then flowed, injected, or molded into the gap between each die 24 and the package core 28. The encapsulation material 26 is then allowed to harden. In a multiple chip arrangement, special care must be taken to properly position the individual dice 24 so that they are properly aligned with one another within the core 28. This is because a single predefined mask will typically be used to form expanded bond pads for all of the individual dice within a package. If such a mask is also used to pattern multiple packages within a single panel, a similar alignment requirement will apply to all dice within the panel. The package core 28 can be formed from a wide variety of different materials. For example, the core material can include, bismaleimide triazine (BT), various resin-based materials, flame retarding glass/epoxy materials (e.g., FR4), polyimide-based materials, ceramic materials, metal materials (e.g., copper), and/or others. In one embodiment, multiple dice 24 are fixed within a single opening in a package core.

Figure 8:
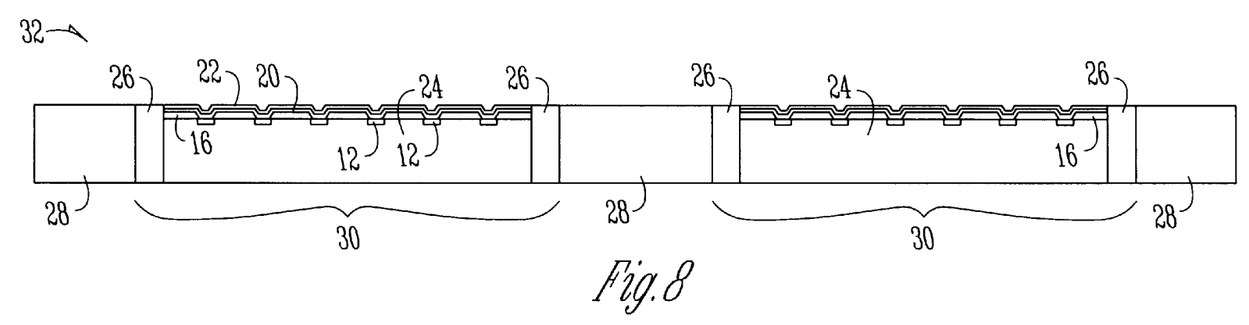
FIGS. 8, 9, 10, 11, and 12 are diagrams illustrating a method for packaging microelectronic dice in accordance with one embodiment of the present invention.

FIGS. 8–12 are a series of diagrams illustrating a method for packaging microelectronic dice 24 in accordance with one embodiment of the present invention. FIG. 8 is a cross sectional side view of the die/core assembly 32 of FIG. 7. As shown, each die 24 is fixed within a corresponding opening 30 in the package core 28 with the upper surface of the protection layer 22 of the die 24 substantially flush with the upper surface of the package core 28. Other configurations for fixing the dice 24 within the core 28 are also possible (e.g., the upper surface of the protection layer 22 can be raised with respect to the upper surface of the core 28, etc.). Each opening 30 can extend fully through the package core 28 (as shown in FIG. 8) or a full or partial floor portion can be provided within the opening 30.

Figure 9:
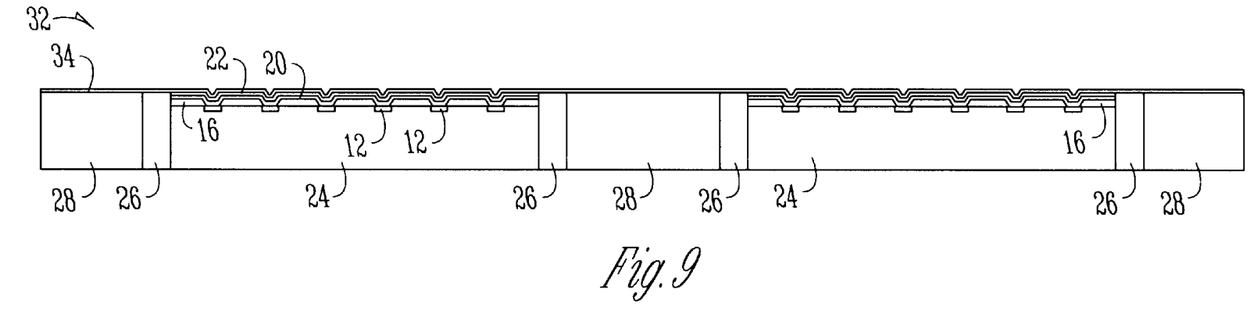
Figure 10:
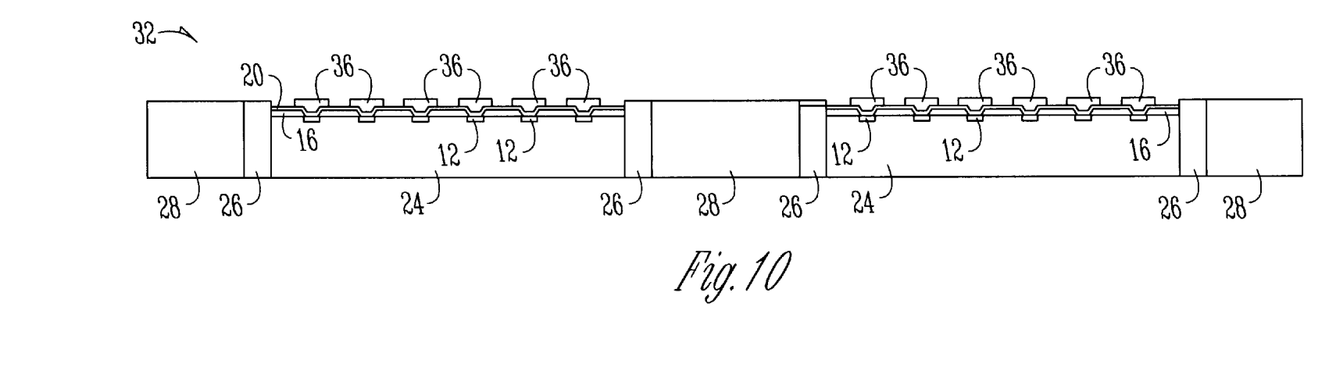
Figure 11:
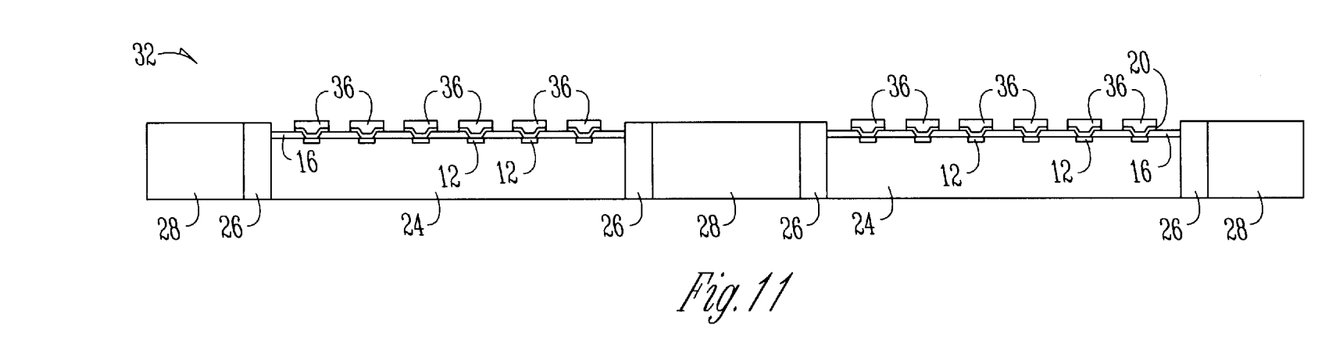

After the dice 24 have been appropriately fixed within the core 28, expanded bond pads are formed on the upper surface of the die/core assembly 32. As will be described in greater detail, the expanded bond pads are applied to, among other things, increase the via alignment budget for the via holes of the first build up metallization layer. FIGS. 9–11 illustrate one technique for applying the expanded bond pads using a semi-additive process. It should be appreciated that other processes can alternatively be used to form the expanded bond pads. As shown in FIG. 9, an electroless seed layer 34 is first applied over the upper surface of the die/core assembly 32. Typically, electroless seed layers are copper, although other metals or alloys are possible. Since the electroless seed layer 34 in the panel area will eventually be completely removed, a special adhesion promotion step is generally not required prior to depositing the electroless seed layer 34. After the electroless seed layer 34 has been deposited, a photoresist mask (not shown) having the desired expanded bond pad pattern is formed over the electroless seed layer 34 in a known manner. The expanded bond pads 36 are then electroplated onto the surface of each die 24 using the electroless seed layer 34 as a current path. As will be appreciated, conductive structures other than an electroless seed layer can alternatively be used to provide a current path during the plating process.

After the expanded bond pads 36 have been deposited, the photoresist mask is stripped. The electroless seed layer 34 is then etched away and the protection layer 22 (applied during wafer processing) is removed. If the electroless seed layer 34 and the protection layer 22 are formed from the same material (e.g., copper), they can both be stripped in a single step. The resulting structure is illustrated in FIG. 10. A modified quick etch process is then performed to remove the adhesion layer material 20 from the regions between and around the expanded bond pads 36. FIG. 11 illustrates the assembly after the expanded bond pads 36 have been fully formed. As shown, some adhesion material 20 remains in the interstice between each expanded bond pad 36 and the underlying passivation layer 16 and bond pad 12. As described previously, this adhesion material provides enhanced adhesion between the expanded bond pad 36 and the passivation layer 16.

Figure 12:
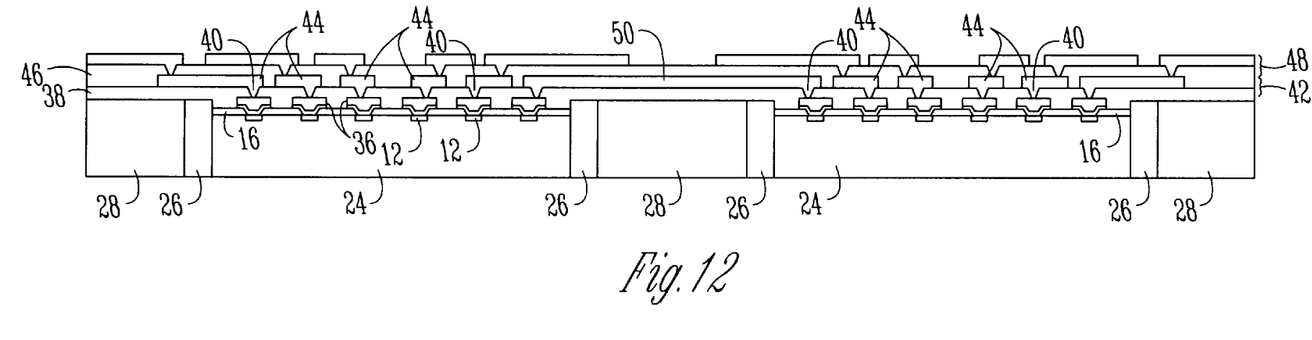

When the expanded bond pad processing is complete, one or more metallization layers are built up over the assembly. FIG. 12 is a sectional side view of the die/core assembly 32 of FIG. 11 after two build up metallization layers 42, 48 have been deposited thereon. A layer of dielectric material 38 is first deposited over the die/core assembly 32. The dielectric layer 38 can be formed from any of a variety of different materials including, for example, glass particle filled epoxy resins (e.g., Ajinomoto Buildup Film (ABF) available from Ajinomoto), bisbenzocyclobutene (B CB) (available from Dow), polyimide, silicone rubber materials (e.g., DC6812 from DowCorning), various low-k dielectrics (e.g., SiLK from Dow Chemical), IPN (available from Ibiden), and others. After the dielectric layer 38 has been applied, a number of via holes 40 are formed through the dielectric layer 38 in locations corresponding to the expanded bond, pads 36. Any available method can be used to form the via holes 40 including, for example, laser techniques, photolithography techniques using wet or dry etching, use of photoimageable dielectric materials, and others.

The first build up metallization layer 42 is then deposited over the dielectric layer 38. As shown, the first build up metallization layer 42 includes a number of conductive elements 44 that are each conductively coupled to an associated expanded bond pad 36 (or multiple bond pads 36) through a corresponding via hole 40 (or multiple via holes 40). The first build up metallization layer 42 (and the other build up layers, if any) may be formed by any known technique, including, but not limited to, semi-additive plating and photo lithographic techniques. As shown in FIG. 12, another dielectric layer 46 and a second build up metallization layer 48 can then be applied in a similar manner. Further build up layers can also be applied. Eventually, a number of external package contacts or leads are formed to provide an interface to an external circuit.

In at least one embodiment, the metallization layers built up over a multiplechip die/core assembly are used to provide inter-chip communication between the individual dice within the package. For example, as shown in FIG. 12, a trace 50 can be provided on the first build up layer 42 to provide a conductive link between the two dice 24. In this manner, signal transmission and or distribution functions can be achieved between the dice in a multiple chip package. For example, a clock signal generated within one die can be distributed to one or more points within another die. Similarly, data generated within one die can be transferred to another die within the package for further processing or for storage. Other arrangements are also possible.

To increase the alignment budget for the vias of the first build up layer (e.g., vias 40 in FIG. 12), the expanded bond pads 36 need to be larger in size than the original bond pad openings in at least one dimension (e.g., length and/or width in a plane defined by the passivation layer 16). In the illustrated embodiment, the expanded bond pads 36 are at least approximately twice the width (i.e., the dimension across the page) of the associated bond pad openings. Although not shown, the expanded bond pads 36 are also at least approximately twice the length (i.e., the dimension into the, page) of the associated bond pad openings. Bond pad expansion ratios of up to 40 are believed possible in accordance with the present invention. The expanded bond pads 36 can be the same shape as the bond pads 12 or a different shape. In one approach, the expanded bond pads 36 are made as large as is reliably possible within the capabilities of the particular deposition process being used. The bond pad openings can also be made smaller to increase the alignment budget between each bond pad 12 and an associated expanded pad 36. Further increases in the alignment budget are possible by, for example, allowing incomplete coverage of the bond pad opening by the expanded bond pad.

In a packaging arrangement where multiple die are fixed within a single core, the most constrained alignment budget is at the layer where the first multiple-die mask is used. This is because both die-to-die and layer-to-layer misalignments will contribute to the overall misalignment at this layer. If the expanded pads are formed on the wafer, the first multiple-die mask is the mask used to form the vias for the first build up layer (e.g., vias 40 in FIG. 12). Thus, given a particular set of overlay design rules, the alignment budget is defined by the difference between the via size and the size of the expanded pads. If the expanded pads are formed on the die/core assembly, as described herein, the first multiple-die mask is the mask used to form the expanded pads. Thus, the alignment budget is defined by the difference between the size of the original bond pads 12 and the size of the expanded bond pads 36. Because it is easier to form small bond pads than it is to form small via holes, the pad expansion on the die/core assembly is preferable for alignment purposes.

As described above, the inventive principles can be used to manufacture multiple-chip microelectronic devices. The inventive principles can also be used to fabricate multiple microelectronic devices on a single panel that is then cut up into individual packaged devices. The packaged devices can be either single-chip or multichip devices. A number of dice that each have conductive adhesion layers thereon are first fixed within corresponding apertures in a panel. The panel forms the package core for each of the devices being fabricated. Expanded bond pads are then deposited over the panel using a single mask, as described above. Build up metallization layers are, then formed and the panel is then divided into multiple independent microelectronic devices. Because the expanded pads are deposited after the dice have been fixed within the panel, the alignment advantages described above in connection with the multiple chip device are realized.

Because the expanded bond pads 36 are raised above the passivation layer 16, the expanded pads 36 make the surface of each die 24 appear much more like the topography typically encountered during the package build up process (i.e., more like the topography of the build up layers 42, 48 themselves). For example, a process to form vias by laser drilling may be much simpler if the via bottom opening falls wholly within the periphery of an expanded pad. The material of the expanded bond pads 36 can also be made more compatible with the material of the build up layers. In one embodiment, for example, both the expanded bond pads 36 and the build up layers 42, 48 are formed from copper, while the bond pads 12 are formed from aluminum.

Figure 13:
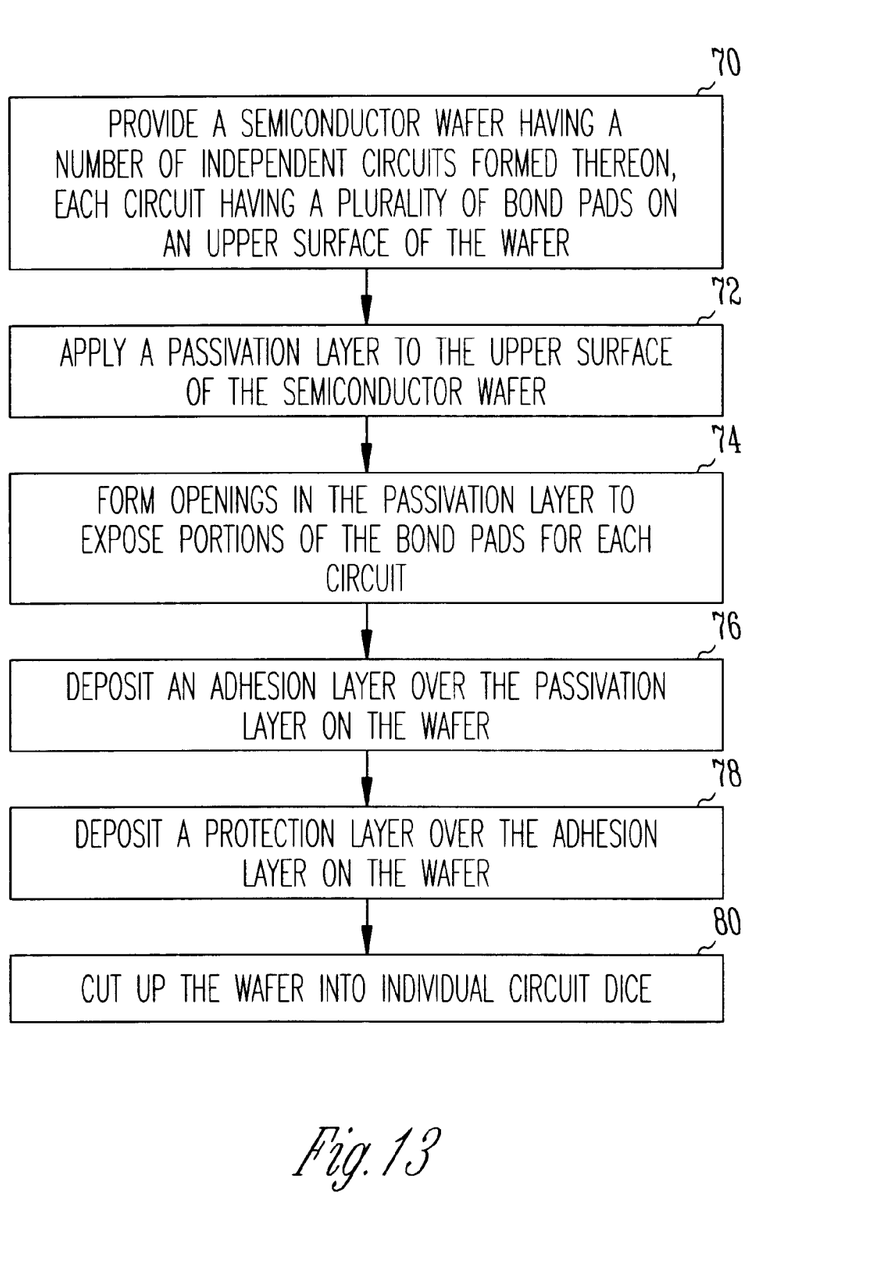
FIG. 13 is a flow chart illustrating a process for manufacturing a microelectronic die in accordance with one embodiment of the present invention.

FIG. 13 is a flow chart illustrating a process for manufacturing a microelectronic die in accordance with one embodiment of the present invention. A semiconductor wafer is first provided that includes a number of independent circuits distributed across the wafer (block 70). Each circuit has a number of bond pads on an upper surface of the wafer. Methods for preparing such wafers are well known in the art and, therefore, will not be described further. Typically, each of the independent circuits on the wafer will be identical with the others. Any of a wide range of circuit types can be formed on the wafer (e.g., digital processing devices, logic circuits, etc.). A passivation layer (or layers) is next deposited on the upper surface of the wafer (block 72). Openings are then formed though the passivation layer to expose portions of the bond pads for each of the circuits (block 74). An adhesion layer is then deposited over the passivation layer on the wafer (block 76). In a preferred approach, the adhesion layer is sputter deposited over the passivation layer, although other deposition techniques can also be used. An optional protection layer is then deposited over the adhesion layer to form a protective barrier therefor (block 78). The wafer is then cut up into individual microelectronic dice to await packaging (block 80).

Figure 14:
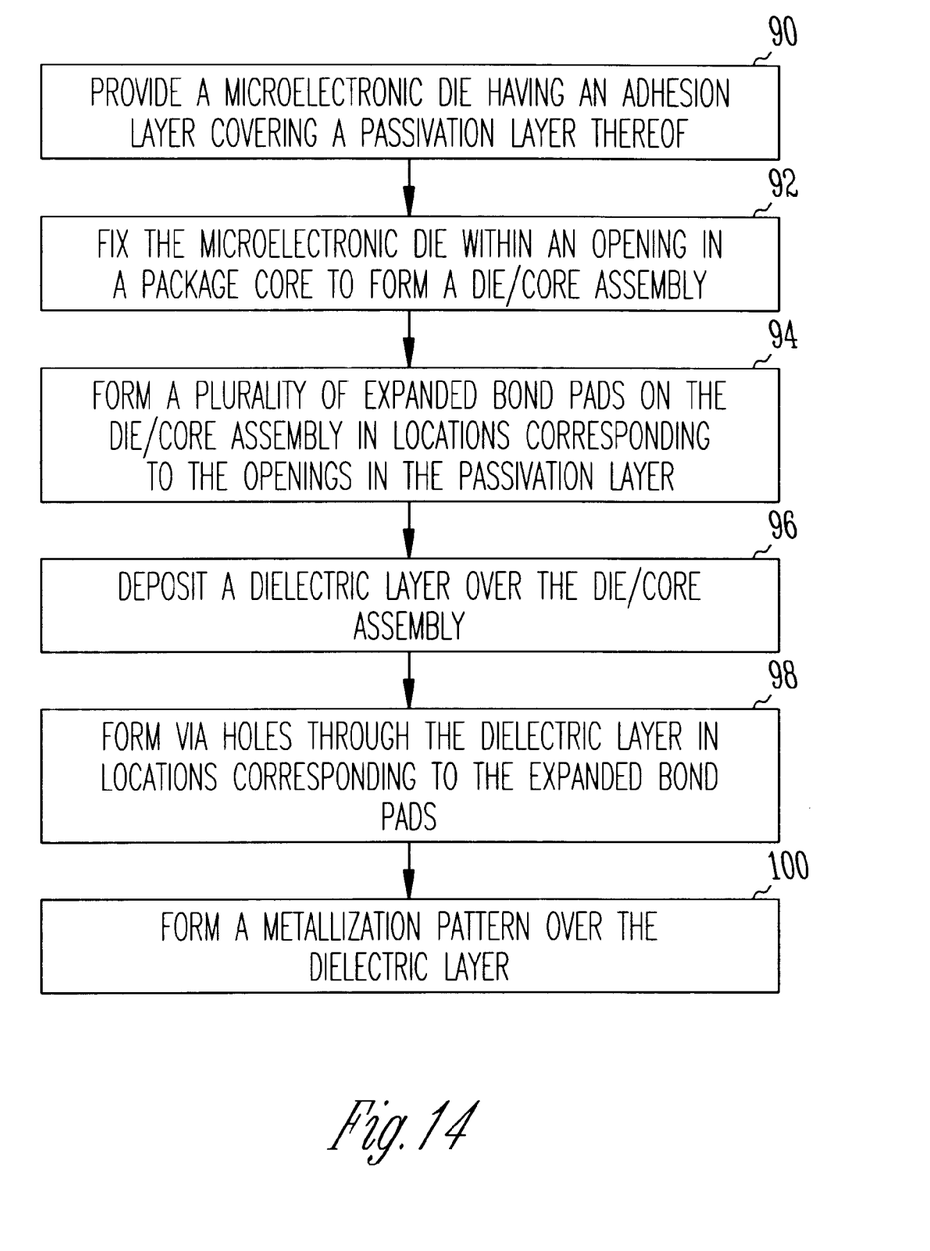
FIG. 14 is a flow chart illustrating a method for packaging a microelectronic die in accordance with one embodiment of the present invention.

FIG. 14 is a flow chart illustrating a method for packaging a microelectronic die in accordance with one embodiment of the present invention. A microelectronic die is provided that has an adhesion layer deposited over a passivation layer thereof (block 90). The adhesion layer is operative for enhancing the adhesion of a metal layer that will subsequently be deposited over the passivation layer. The passivation layer has a plurality of openings formed therethrough in locations corresponding to a plurality of bond pads on the die. The microelectronic die is fixed within an opening in a package core to form a die/core assembly (block 92). A number of expanded bond pads are then formed on the die/core assembly in locations corresponding to openings in the passivation layer (block 94). In some cases, a single expanded bond pad may encompass multiple openings in the passivation layer. A dielectric layer is next deposited over the die/core assembly and the expanded bond pads (block 96). Via holes are then formed through the dielectric layer in locations corresponding to the expanded bond pads (block 98). In some cases, it may be desirable to have multiple via holes opening onto a single expanded bond pad. A metallization pattern is then formed over the dielectric layer that is conductively coupled to the expanded bond pads through the corresponding via holes (block 100). Further dielectric layers and metallization patterns can also be applied in a similar manner.

Although FIGS. 1–12 illustrate various views and embodiments of the present invention, these figures are not meant to portray microelectronic assemblies in precise detail. For example, these figures are not typically to scale. Rather, these figures illustrate microelectronic assemblies in a manner that is believed to more clearly convey the concepts of the present invention. In addition, it should be appreciated that the present invention does not require a one to one correspondence between expanded pads and bond pads. For example, in at least one embodiment, expanded pads are provided for only a subset of the bond pads of the die.

Although the present invention has been described in conjunction with certain embodiments, it is to be understood that modifications and variations may be resorted to without departing from the spirit and scope of the invention as those skilled in the art readily understand. For example, it should be understood that various additional acts can be performed (e.g., intermediate cleaning acts, surface roughening acts, etc.) and structures created (e.g., additional adhesion layers, seed layers, etc.) during device fabrication in accordance with the present invention. Such modifications and variations are considered to be within the purview and scope of the invention and the appended claims.

What is claimed is:

1. A method for use in fabricating a microelectronic device, comprising:
   providing a semiconductor wafer having a plurality of independent circuits formed thereon, said independent circuits each having bond pads on an upper surface of said semiconductor wafer;
   forming a passivation layer over said upper surface of said semiconductor wafer, said passivation layer having openings in positions corresponding to bond pads on said upper surface of said semiconductor wafer;
   depositing a conductive adhesion layer over said passivation layer;

cutting said semiconductor wafer into a plurality of individual circuit dice after said conductive adhesion layer has been deposited;

fixing a first die from said plurality of individual circuit dice within a package core to form a die/core assembly; and forming expanded bond pads over said die/core assembly in positions corresponding to openings in said passivation layer of said first die.

2. The method claimed in claim 1 wherein:

said conductive adhesion layer is deposited using a sputter deposition process.

3. The method claimed in claim 1 wherein:

said conductive adhesion layer is formed from a material that improves the adhesion of copper to said passivation layer.

4. The method claimed in claim 1 wherein:

said conductive adhesion layer is formed from titanium.

5. The method claimed in claimed 1 comprising:

depositing a protection layer over said conductive adhesion layer before cutting said semiconductor wafer.

6. The method claimed in claim 5 wherein:

said protection layer is deposited using a sputter deposition process.

7. The method claimed in claim 6 wherein:

said protection layer is sputter deposited after said adhesion layer without a vacuum break.

8. The method claimed in claim 5 wherein:

said protection layer is formed from the same material as said expanded bond pads.

9. The method claimed in claim 5 wherein:

said protection layer is formed from copper.

10. The method claimed in claim 1 wherein:

said semiconductor wafer includes a plurality of independent microprocessor circuits.

11. The method claimed in claim 1 wherein:

forming expanded bond pads includes forming a first expanded bond pad that encompasses at least two of said openings in said passivation layer of said first die.

12. A method for use in packaging a microelectronic device, comprising:

providing a microelectronic die having a conductive adhesion layer deposited over a passivation layer thereof, said passivation layer having openings in locations corresponding to bond pads of said microelectronic die;

fixing said microelectronic die within a package core to form a die/core assembly;

forming expanded bond pads over said die/core assembly in locations corresponding to bond pads of said microelectronic die; and removing said conductive adhesion layer from regions on said die/core assembly about said expanded bond pads.

13. The method of claim 12, wherein:

said conductive adhesion layer is sputter deposited over said passivation layer.

14. The method of claim 12, wherein:

said conductive adhesion layer includes titanium.

15. The method of claim 12, wherein:

providing a microelectronic die includes providing a die having a protection layer deposited over said conductive adhesion layer, said protection layer protecting said conductive adhesion layer from oxidation and contamination.

16. The method of claim 12, wherein:

fixing said microelectronic die within a package core includes fixing said microelectronic die within said package core using an encapsulation material.

17. The method of claim 16, wherein:

fixing said microelectronic die within a package core includes holding said microelectronic die within an opening in said package core, introducing an encapsulation material into said opening to fill a gap between said microelectronic die and said package core, and allowing said encapsulation material to harden.

18. The method of claim 12, wherein:

forming expanded bond pads includes depositing a conductive seed layer over a surface of said die/core assembly.

19. The method of claim 18, wherein:

forming expanded bond pads includes pattern-plating said expanded bond pads on said die/core assembly using said conductive seed layer and then removing said conductive seed layer from regions on said die/core assembly about said expanded bond pads.

20. The method of claim 18, wherein:

depositing a conductive seed layer includes depositing an electroless seed layer.

21. The method of claim 12, further comprising:

depositing a dielectric layer over said die/core assembly after removing said conductive adhesion layer;

forming via holes through said dielectric layer to expose portions of said expanded bond pads; and depositing a metallization layer on said dielectric layer, said metallization layer contacting said exposed portions of said expanded bond pads through said via holes.

22. The method of claim 21, wherein:

forming via holes includes using laser ablation.

23. The method of claim 12, wherein:

forming expanded bond pads includes forming a first expanded bond pad that encompasses at least two of said bond pads of said microelectronic die.

24. A method for use in packaging a microelectronic device comprising:

providing at least two microelectronic dice each having a conductive adhesion layer deposited over a passivation layer thereof, said passivation layer having openings in locations corresponding to bond pads of said microelectronic die;

fixing said at least two microelectronic dice within a panel to form a panel assembly;

forming expanded bond pads over said panel assembly in locations corresponding to bond pads of said at least two microelectronic dice; and removing said conductive adhesion layer from regions on said panel assembly about said expanded bond pads.

25. The method of claim 24, wherein:

forming expanded bond pads includes forming expanded bond pads for more than one of said at least two microelectronic dice within said panel simultaneously using a single mask.

26. The method of claim 24, wherein:

fixing said at least two microelectronic dice within a panel includes fixing each of said at least two microelectronic dice within a separate opening in said panel.

27. The method of claim 24, wherein:

fixing said at least two microelectronic dice within a panel includes fixing said at least two microelectronic dice within a single opening in said panel.

28. The method of claim 24, further comprising:

depositing a dielectric layer over said panel assembly after removing said conductive adhesion layer;

forming via holes through said dielectric layer to expose portions of said expanded bond pads; and depositing a metallization layer on said dielectric layer, said metallization layer contacting said exposed portions of said expanded bond pads through said via holes.

29. The method of claim 28, wherein:

said metallization layer includes at least one trace to conductively couple an expanded bond pad associated with a first microelectronic die to an expanded bond pad associated with a second microelectronic die.

30. The method of claim 24, wherein:

said panel and said at least two microelectronic dice form a single microelectronic device.

31. The method of claim 24, further comprising:

cutting up said panel assembly to form multiple individual microelectronic devices.

* * * * *